United States Patent [19]

Soukup

[11] Patent Number: 5,248,382

[45] Date of Patent: Sep. 28, 1993

[54] PROCESS FOR MANUFACTURE OF PRINTED CIRCUIT BOARDS BY ETCHING

[75] Inventor: Vaclav Soukup, Rio de Janeiro, Brazil

[73] Assignee: Maria Helena Soukup, Jacarepagua, Brazil

[21] Appl. No.: 832,310

[22] Filed: Feb. 7, 1992

[30] Foreign Application Priority Data

Feb. 8, 1991 [BR] Brazil .................... PI9100566[U]

[51] Int. Cl.$^5$ ............................ C23F 1/00; B44C 1/22
[52] U.S. Cl. .................... 156/642; 156/656; 156/666; 156/902
[58] Field of Search ........... 156/642, 656, 659.1, 156/666, 901, 902; 134/10, 13; 252/79.2, 79.4

[56] References Cited

U.S. PATENT DOCUMENTS 3,772,105  11/1973  Shipley .......................... 156/642
4,428,773  1/1984   Krotz ........................... 156/642 X
4,915,776  4/1990   Lee ............................. 156/642

Primary Examiner—William A. Powell
Attorney, Agent, or Firm—Howard L. Rose

[57] ABSTRACT

In the manufacture of printed circuits according to the present state of the art, employing ammonia solutions for removing metallic copper from printed circuit boards, the common practice is to use the solutions until saturated with copper, and then replacing them with new solutions. In the process of the invention, the solutions are used continuously, including in the process a decanter or other way of separating solids from liquids, like filtration, centrifugation, and the like, removing the separated solids from the process (for posterior neutralization), and adding to the process a regenerating solution and/or aqueous ammonia and/or gaseous ammonia.

5 Claims, No Drawings

PROCESS FOR MANUFACTURE OF PRINTED CIRCUIT BOARDS BY ETCHING

BACKGROUND OF THE INVENTION

The present invention refers to manufacture of printed circuit boards, employing solutions of ammonia and ammonia salts for removing metallic copper from circuit boards. The ammonia solutions mentioned above contain ammonia and salts of ammonia, like chloride, sulphate, carbonate, and others. The present practice in this industry is to use the solutions until they become saturated with copper, and after that, substituting new solutions. These materials are acquired from specialized manufacturers for high prices and, thus, represent a considerable part of the cost of fabrication of printed circuits.

These solutions, when saturated with copper, are very toxic, present a clear danger to the environment, and thus have to be shipped to processing centers where the toxic components are neutralized. The processing centers are usually far from the printed circuit board factories, and the cost of transport is high. The solutions saturated with copper are corrosive, besides being toxic. This fact increases still more the cost of transportation.

At the present state of the art, these solutions are changed when the copper concentration attains about 100 g of metallic copper for 1000 g of solution. In this stage, the solution contains almost exclusively copper tetraammona chloride (or sulphate, carbonate or other salts).

BRIEF DESCRIPTION OF THE INVENTION

According to this invention, the useful life of these solutions is increased extraordinarily by introducing small alterations in their use and by simple and low cost changes of the equipment. By this process, the ammonia solutions can be used, theoretically, without changing them. Only small quantities of new solutions are added, in order to compensate for the losses caused by evaporation and the carryover on the printed circuit boards. Basically, the new process lowers the cost of the solutions by at least 90%, with a similar decrease of transportation costs.

Another advantage is greater speed of etching of the boards, because the solutions permanently contain the highest concentration of cupric salts. The excess of copper precipitates in form of cuprous or cupric oxide, according to conditions. Both oxides are heavy and settle rapidly.

To practice the new process, the only modification of equipment necessary is the inclusion of a decanter where the circulation of the solution is slowed down, in order to permit the oxide to settle. Other methods of separation of the oxide may be employed, like centrifugation, filtration, or any other method for separation of a solid from a liquid phase. In the decanter, the excess copper accumulates in the form of a heavy oxide, which is extracted periodically and sent to the processing center. Note that the weight of the oxide transported to the processing center represents only 10-15% of the weight of the saturated solution, which is now transported according to the present state of the art. The reduction of volume to be transported is even greater than the 85-90% of diminished weight. The physical form of the oxide is of a humid solid or of a semi-solid sludge, whose transport is much safer and cheaper than that of a corrosive liquid.

Another modification of the actual process which may be desirable is the separation of the dissolution of the metallic copper from the oxidation of the cuprous ion. Presently, both processes are run simultaneously. Using the saturated ammonia copper solution, according to this invention, the precipitation of the copper oxide mentioned above may occur on the printed circuit board, which can disturb the dissolution of the metallic copper. In such a case, the etching of the printed circuit boards is performed in absence of air oxygen, e.g. inside the solution. The oxidation of the cuprous ion is run separately, e.g. by air sparging of the solution. The additions of new solution (i.e. of the "regenerating solution") are restricted to compensation of losses in the process and in the oxide sludge. Another addition which may be necessary is that of small quantities of concentrated aqueous ammonia, in order to replace the ammonia evaporated in the process. Note that the price of aqueous ammonia is much lower than that of the "regenerating solutions".

DETAILED DESCRIPTION OF THE INVENTION

Comparative Example No. 1 of the efficiency of the process

In a process of fabrication of printed circuit boards by etching with ammonia copper solution, according to present practice, which practice consumes daily one ton of the "regenerating solution" (solution of ammonium chloride, ammonium carbonate and ammonia), there was introduced into the equipment a simple decanter of a cubic meter in the form of a closed vessel placed before the filter in the return path of the solution to the bath. The flow velocity in the decanter was decreased sufficiently, relative to prior art processing, to permit settling of solids in the decanter. Instead of daily draining one ton of the saturated solution and replacing it by equal volume of the "regenerating solution", according to the present practice, the process was continued without interruption. In the decanter, cuprous oxide was settling in a quantity equivalent to the dissolved copper. No difficulty was observed in the etching, which continued as before.

There were necessary additions of 260 kg per week of the "regenerating solution" and of 80 kg of aqueous ammonia of 24%, in order to compensate the losses by evaporation and by the carryover on the boards. The decanter was emptied twice a week, drawing about 280 kg of the cuprous oxide sludge each time. This was packed in polyethylene bags and sent to the processing center. In order to avoid stopping the process for withdrawal of the sludge, another decanter was installed in parallel with the first one.

From this demonstrative example the advantages of the process are evident, principally the cost reduction: instead of buying five tons of "regenerating solution" per week, and shipping an equivalent quantity to the processing centers, only 260 kg of the solution and 80 kg of ammonia were consumed. In consequence, the shipments to the processing center were reduced from five tons to 560 kg per week, which represents great simplification of operation and reduction of cost.

Comparative Example No. 2

In the process described in Example No. 1, in the case of certain printed circuit boards there was noted precipitation of cuprous oxide on the surface of the boards which hampered the process. The conditions of the etching were altered, immersing the boards in the solution instead of aspersing it onto them. Another vessel was added to the circuit, where the cuprous ion was oxidized by air sparging. In this way, the problem of cuprous oxide on the surface of the boards was eliminated, and the efficiency of the process was restored.

Once given the above disclosure, many other features, modifications and improvements will become apparent to the skilled artisan. Such features, modifications and improvements are, therefore, considered to be a part of this invention, the scope of which is to be determined by the following claims.

I claim:

1. A process for manufacture, by etching, of printed circuit boards comprising
   subjecting the board to a solution containing an ammonia copper solution,
   removing dissolved copper in the form of a copper oxide from the solution after it has become saturated with copper,
   removing the copper oxide from the solution by directing it into a vessel in which it is caused to slow down sufficiently that the copper oxides settle to the bottom of the vessel, and
   removing the copper oxides from the vessel and recirculating the remaining solution from which the copper oxides have been removed.

2. A process for manufacture, by etching, of printed circuit boards, employing solutions comprising ammonia and ammonium salts selected from a group comprising chlorides, sulphates and/or carbonates according to claim 1, characterized by the fact that oxidation of cuprous ions on the surface of a board is performed separately from the process of etching the boards.

3. A process for manufacture, by etching, of printed circuit boards, according to claim 1 or 2, characterized by the fact that the losses of the solution in the process are replaced by the remaining solution, not saturated with copper and/or aqueous and/or gaseous ammonia.

4. A process for manufacture of printed circuit boards according to claim 1 wherein the board is immersed in said solution.

5. A process for manufacture of printed circuit boards according to claim 1 wherein said solution is flowed over the board.

* * * * *